(12) United States Patent
Goto

(10) Patent No.: US 8,790,007 B2
(45) Date of Patent: Jul. 29, 2014

(54) SEMICONDUCTOR MANUFACTURING APPARATUS MEMBER

(75) Inventor: Yoshinobu Goto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 13/459,695

(22) Filed: Apr. 30, 2012

(65) Prior Publication Data

US 2012/0211933 A1    Aug. 23, 2012

Related U.S. Application Data

(63) Continuation of application No. PCT/JP2011/071603, filed on Sep. 22, 2011.

(60) Provisional application No. 61/386,011, filed on Sep. 24, 2010.

(51) Int. Cl.
*G01K 13/00* (2006.01)

(52) U.S. Cl.
USPC .......................................................... 374/141

(58) Field of Classification Search
USPC .......................................................... 374/141
See application file for complete search history.

(56) References Cited

U.S. PATENT DOCUMENTS

2010/0163183 A1 *   7/2010   Tanaka et al. ............ 156/345.27
2011/0005686 A1     1/2011   Tanaka et al.

FOREIGN PATENT DOCUMENTS

| JP | 2005-166354 A1 | 6/2005 |
|---|---|---|
| JP | 2006-253723 A1 | 9/2006 |
| JP | 2007-088484 A1 | 4/2007 |
| JP | 2010-109346 A1 | 5/2010 |
| KR | 10-2010-0031110 A | 3/2010 |
| WO | 2009/001866 A1 | 12/2008 |

OTHER PUBLICATIONS

International Search Report and Written Opinion dated Nov. 1, 2011.

* cited by examiner

*Primary Examiner* — Lisa Caputo
*Assistant Examiner* — Brandi N Hopkins
(74) *Attorney, Agent, or Firm* — Burr & Brown, PLLC

(57) ABSTRACT

A ceramic heater includes a disk-shaped ceramic plate and a shaft. The ceramic plate includes a wafer-placing surface. The shaft has a hollow shape and is bonded to a surface of the ceramic plate opposite to the wafer-placing surface. A thermocouple conduit is formed in the ceramic plate so as to extend from a central portion of the ceramic plate to a position which is short of an outer peripheral surface of the ceramic plate. A thermocouple guide having a pipe-like shape is attached to the back surface of the ceramic plate. A guide hole in the thermocouple guide is connected to a portion of the thermocouple conduit at the central portion of the ceramic plate. The guide hole is disposed so as to be inclined with respect to the direction in which the thermocouple conduit extends.

10 Claims, 6 Drawing Sheets

(a)

(b)

(a)

(b)

SEMICONDUCTOR MANUFACTURING APPARATUS MEMBER

BACKGROUND OF THE INVENTION

1. Field of the Invention

The present invention relates to a semiconductor manufacturing apparatus member.

2. Description of Related Art

Semiconductor manufacturing apparatuses are used to fix a wafer in place and to heat and cool the wafer in an etching system, an ion implantation system, an electron beam lithography system, and the like. Known examples of members used in such semiconductor manufacturing apparatuses (semiconductor manufacturing apparatus members) include so-called two-zone heaters. A two-zone heater includes a disk-shaped ceramic plate having a wafer-placing surface and heaters that are independently embedded in an inner peripheral portion and an outer peripheral portion of the ceramic plate (see, for example, Patent Document 1). In a two-zone heater, an inner resistance heating element and an outer resistance heating element are independently embedded in a ceramic plate, and a power terminal is attached to each of the resistance heating elements. Heat generated by each of the resistance heating elements is independently controlled by independently applying a voltage to each of the resistance heating elements. To be specific, the temperatures of an inner peripheral portion and an outer peripheral portion of the ceramic plate are measured, and heat generated by each of the resistance heating elements is controlled so that the entire surface of the ceramic plate has a target temperature. Known examples of a method of measuring the temperatures of an inner peripheral portion and an outer peripheral portion of the ceramic plate include a method that involves forming a hole for a thermocouple in each of the zones, i.e., in each of the inner peripheral portion and the outer peripheral portion, disposing thermocouples in the holes, and measuring the temperatures by using the thermocouples (see, for example, Patent Document 2).

Patent Document 1: JP 2007-88484 A

Patent Document 2: JP 2005-166354 A

SUMMARY OF THE INVENTION

However, when forming a hole for a thermocouple in the outer peripheral portion and disposing the thermocouple in the hole, the following problem arises. That is, thermocouples and electric wires are usually disposed in a hollow shaft that is attached to a surface of the ceramic plate opposite to the wafer-placing surface. Therefore, it is necessary that the shaft have a large diameter so that a thermocouple can be disposed in a hole formed in an outer peripheral portion of the ceramic plate. In this case, however, it may happen that a lifter pin for raising and lowering a wafer above the wafer-placing surface cannot be set. This is because, there may not be sufficient space for disposing the lifter pin, which is inserted into a through-hole formed in an outer peripheral portion of the ceramic plate outside the shaft, if the diameter of the shaft is too large and thereby a region of the ceramic plate outside the shaft is too small.

Alternatively, a thermocouple conduit may be embedded in the ceramic plate so as to extend parallel to the wafer-placing surface from a central portion of the ceramic plate to a position which is short of the outer peripheral surface of the ceramic plate, a hole may be formed in the ceramic plate so as to be connected to an end portion of the thermocouple conduit in the central portion of the ceramic plate, and the thermocouple may be inserted through the hole into the thermocouple conduit. However, there is a problem in that it is difficult to insert a thermocouple through a vertical hole into a horizontal thermocouple conduit because it has to pass through a corner that is curved by about 90°.

The main object of the present invention, which has been achieved to solve such problems, is to provide a semiconductor manufacturing apparatus member in which a thermocouple is inserted into a thermocouple conduit extending from a central portion of a ceramic plate to a position which is short of the outer peripheral surface of the ceramic plate and that is easy to manufacture.

To achieve the main object, a semiconductor manufacturing apparatus member according to the present invention is constructed as follows.

According to the present invention, a semiconductor manufacturing apparatus member includes a disk-shaped ceramic plate including a wafer-placing surface; a thermocouple conduit disposed in the ceramic plate so as to extend from a central portion of the ceramic plate to a position which is short of an outer peripheral surface of the ceramic plate; a thermocouple guide including a guide hole extending from a surface of the ceramic plate opposite to the wafer-placing surface so as to be connected to a portion of the thermocouple conduit at the central portion of the ceramic plate; and a thermocouple extending through the guide hole and the thermocouple conduit, the thermocouple being disposed so that a temperature sensing portion thereof is in contact with a closed end of the thermocouple conduit, the closed end being located at the position which is short of the outer peripheral surface of the ceramic plate. The guide hole is disposed so as to be inclined with respect to a direction in which the thermocouple conduit extends so that the guide hole makes an obtuse angle with the thermocouple conduit, or the guide hole is disposed so as to extend in a direction closer to the direction in which the thermocouple conduit extends with decreasing distance of the guide hole from the thermocouple conduit.

With the semiconductor manufacturing apparatus member according to the present invention, when inserting the thermocouple into the thermocouple conduit, the thermocouple is inserted into the thermocouple conduit through the guide hole in the thermocouple guide. In the case where the guide hole is disposed so as to be inclined with respect to the direction in which the thermocouple conduit extends, the angle between the guide hole and the thermocouple conduit is an obtuse angle. Therefore, it is unlikely that a front end of the thermocouple is trapped at a corner when the front end enters through the guide hole into the thermocouple conduit. In the case where the guide hole is disposed so as to extend in a direction closer to the thermocouple conduit extends with decreasing distance of the guide hole from the thermocouple conduit, the guide hole is curved so that the direction thereof continuously changes. Therefore, it is unlikely that the front end of the thermocouple is trapped at a corner when the front end enters through the guide hole into the thermocouple conduit. Thus, because the semiconductor manufacturing apparatus member according to the present invention is provided with the thermocouple guide, an operation of inserting the thermocouple into the thermocouple conduit can be smoothly performed and thereby the semiconductor manufacturing apparatus member can be easily manufactured. As a result, the productivity is improved.

In the semiconductor manufacturing apparatus member according to the present invention, a portion of the guide hole that is disposed so as to extend in a direction closer to the direction in which the thermocouple conduit extends with decreasing distance of the guide hole from the thermocouple conduit may be formed as a circular arc or an elliptic arc. In this case, an operation of inserting the thermocouple into the thermocouple conduit can be performed more smoothly.

In the semiconductor manufacturing apparatus member according to the present invention, the thermocouple guide may be made from the same material as the ceramic plate. In this case, the thermocouple guide and the ceramic plate can be integrated with each other by, for example, diffusion bonding.

In the semiconductor manufacturing apparatus member according to the present invention, the thermocouple may be pressed by a spring so that the temperature sensing portion is in contact with the closed end. In this case, the temperature sensing portion of the thermocouple is continuously pressed against the closed end of the thermocouple conduit by the spring. Thus, the accuracy with which the temperature of an outer peripheral portion of the ceramic plate is measured is increased.

In the semiconductor manufacturing apparatus member according to the present invention, the thermocouple conduit may be a hole that is formed by drilling the ceramic plate from the outer peripheral surface toward a center of the ceramic plate, and sealing an end portion of the thermocouple conduit that is open in the outer peripheral surface with a cap that is made from the same material as the ceramic plate. In this case, the thermocouple conduit can be formed comparatively easily.

The cap may include a support portion that supports the temperature sensing portion disposed at a front end of the thermocouple at a position at which the cap is in contact with the temperature sensing portion. In this case, the temperature sensing portion of the thermocouple is in contact with the same position on the cap while being supported by the support portion of the cap. Therefore, the accuracy with which temperature is measured is increased. The support portion may be a tapered portion that is horizontally drilled and has a diameter that decreases with decreasing distance of the support portion from the outer peripheral surface of the ceramic plate. Alternatively, the support portion may be a tunnel portion that is formed so as to extend from the tapered portion toward the outer peripheral surface of the ceramic plate and that has a diameter substantially the same as that of the temperature sensing portion of the thermocouple.

In the semiconductor manufacturing apparatus member according to the present invention, the ceramic plate may include a pair of thin plates that are surface-bonded to each other, and the thermocouple conduit may be formed by a passage groove formed in a bonding surface of at least one of the pair of thin plates. Also in this case, the thermocouple conduit can be formed comparatively easily. In the case where the passage groove is formed to reach the outer peripheral surface of the ceramic plate, the thermocouple conduit has an end portion that is open in the outer peripheral surface, so that it is necessary to seal the end portion with the cap. In contrast, in the case where the passage groove is formed to a position which is short of the peripheral surface of the ceramic plate, the end portion of the thermocouple conduit does not reach the outer peripheral surface, so that the cap is not necessary.

The passage groove may include a support portion for supporting the temperature sensing portion disposed at a front end of the thermocouple at the closed end at which the passage groove in contact with the temperature sensing portion. In this case, the temperature sensing portion of the thermocouple is in contact with the same position at the closed end of the passage groove while being continuously supported by the support portion disposed at the closed end. Therefore, the accuracy with which temperature is measured is increased. The support portion may be a tapered portion that has a diameter that decreases with decreasing distance of the support portion from the outer peripheral surface of the ceramic plate. Alternatively, the support portion may be a tunnel portion that is formed so as to extend from the tapered portion toward the outer peripheral surface of the ceramic plate and that has a diameter substantially the same as that of the temperature sensing portion of the thermocouple.

BRIEF DESCRIPTION OF DRAWINGS

FIG. 2 illustrate partial sectional views of a ceramic heater that is different from the ceramic heater 10, part (a) illustrating a state before insertion of a temperature sensing portion 50a, and part (b) illustrating a state after insertion of the temperature sensing portion 50a.

FIG. 3 illustrate partial sectional views of a ceramic heater that is different from the ceramic heater 10, part (a) illustrating a state before insertion of the temperature sensing portion 50a, and part (b) illustrating a state after insertion of the temperature sensing portion 50a.

DETAILED DESCRIPTION OF THE INVENTION

Figure 1:
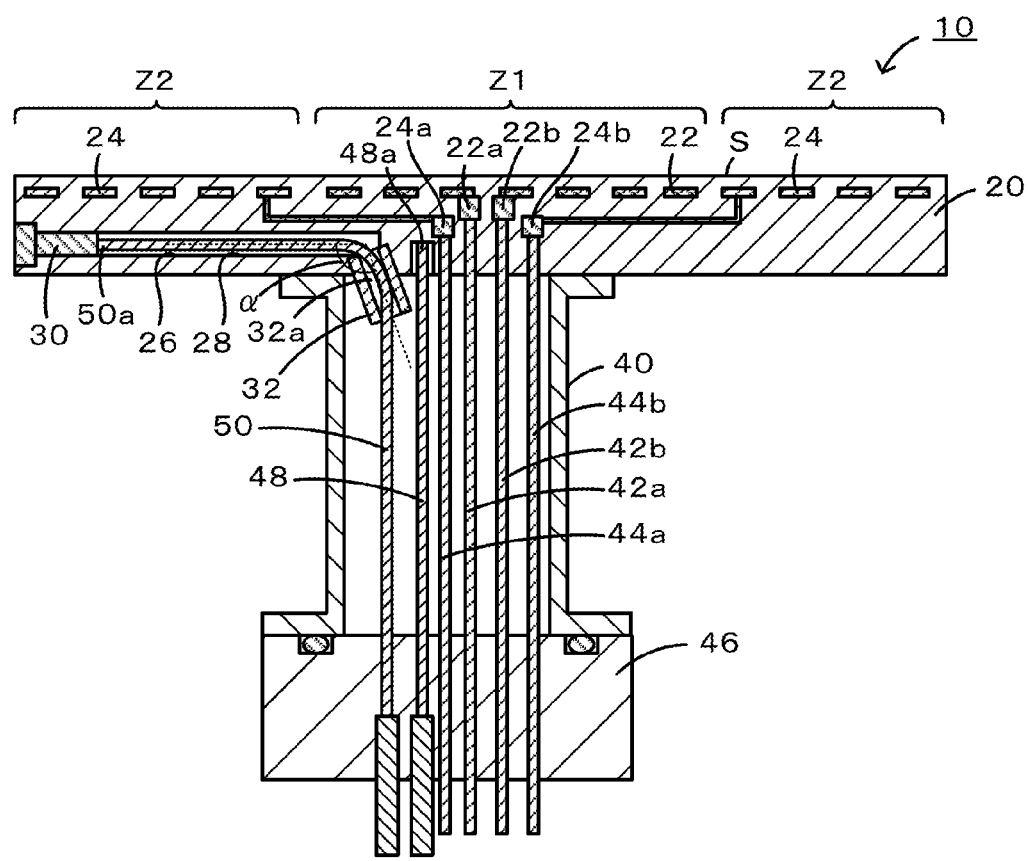
FIG. 1 is a longitudinal sectional view of a ceramic heater 10.

Hereinafter, preferred embodiments of the present invention will be described with reference to the drawings. FIG. 1 is a longitudinal sectional view of a ceramic heater 10.

The ceramic heater 10, which is a semiconductor manufacturing apparatus member, includes a disk-shaped ceramic plate 20 and a shaft 40. The ceramic plate 20 includes a surface that serves as a wafer-placing surface S. The shaft 40 has a hollow shape and is bonded to a surface (back surface) of the ceramic plate 20 opposite to the wafer-placing surface S.

The ceramic plate 20 is a disk-shaped plate made from a ceramic material such as aluminium nitride or alumina. An inner resistance heating element 22 and an outer resistance heating element 24 are embedded in the ceramic plate 20. The resistance heating elements 22 and 24 are strip-shaped members mainly made from, for example, tungsten or tungsten carbide. The inner resistance heating element 22 is formed along a unicursal curve that extends from an anode terminal 22a disposed near the center of the ceramic plate 20, over the entire area of a small circular region Z1 containing the center of the ceramic plate 20, to a cathode terminal 22b disposed adjacent to the anode terminal 22a. The outer resistance heating element 24 is formed along a unicursal curve that extends from an anode terminal 24a disposed near the center of the ceramic plate 20, over the entire area of an annular circular region Z2 around the small circular region Z1, to a cathode terminal 24b disposed adjacent to the anode terminal 24a. Specific examples of wiring patterns of the resistance heating elements 22 and 24, which are not illustrated here, may be the same as that illustrated in FIG. 1 of Patent Document 1.

A thermocouple conduit 26 is formed in the ceramic plate 20 so as to extend from a central portion of the ceramic plate 20 to a position which is short of an outer peripheral surface of the ceramic plate 20. The thermocouple conduit 26 extends parallel to the wafer-placing surface S. However, the thermocouple conduit 26 need not be parallel to the wafer-placing surface S but may be inclined with respect to the wafer-placing surface S. The thermocouple conduit 26 includes a drilled hole 28 and a cap 30. The drilled hole 28 is formed by drilling the ceramic plate 20 radially inward from the outer peripheral surface toward the center of the ceramic plate 20. The cap 30 closes an opening of the drilled hole 28. The cap 30 is made from the same material as the ceramic plate 20. A thermocouple guide 32 having a pipe-like shape is attached to the back surface of the ceramic plate 20 so as to protrude from the back surface of the ceramic plate 20. The thermocouple guide 32 is made from the same material as the ceramic plate 20. Attachment of the thermocouple guide 32 may be performed by diffusion bonding, brazing, screwing, or the like. Here, diffusion bonding is used. The thermocouple guide 32 has a guide hole 32a, which is an inner passage. The guide hole 32a is connected to a portion of the thermocouple conduit 26 at the central portion of the ceramic plate 20. The guide hole 32a is inclined with respect to the direction in which the thermocouple conduit 26 extends so that the guide hole 32a forms an obtuse angle with the thermocouple conduit 26.

The shaft 40 is made from the same material as the ceramic plate 20. One end of the shaft 40 is diffusion bonded to the ceramic plate 20. The other end of the shaft 40 is hermetically connected to a support base 46 by using an O-ring. Power feed rods 42a and 42b, which are respectively connected to the anode terminal 22a and the cathode terminal 22b of the inner resistance heating element 22, and power feed rods 44a and 44b, which are respectively connected to the anode terminal 24a and the cathode terminal 24b of the outer resistance heating element 24 are disposed in the shaft 40. An inner thermocouple 48 for measuring the temperature in the vicinity of the center of the ceramic plate 20 and an outer thermocouple 50 for measuring the temperature in the vicinity of an outer periphery of the ceramic plate 20 are also disposed in the shaft 40. The inner thermocouple 48 is inserted into a recess formed at the center of the back surface of the ceramic plate 20. A temperature sensing portion 48a at the front end of the inner thermocouple 48 is in contact with the ceramic plate 20. The outer thermocouple 50 extends through the guide hole 32a in the thermocouple guide 32 and the thermocouple conduit 26. A temperature sensing portion 50a at the front end of the outer thermocouple 50 is in contact with the back side of the cap 30. The outer thermocouple 50 extends vertically in the shaft 40, is curved in the guide hole 32a and in the vicinity of the guide hole 32a, and extends horizontally in the thermocouple conduit 26. The back surface of the cap 30 corresponds to a closed end of the thermocouple conduit 26 that is located at a position which is short of the outer peripheral surface of the ceramic plate 20.

Next, an exemplary process of making the ceramic heater 10 will be described. First, the ceramic plate 20, in which the inner resistance heating element 22, the outer resistance heating element 24, and the terminals 22a, 22b, 24a, and 24b have been embedded, is prepared. Subsequently, holes are formed from the back surface of the ceramic plate 20 toward the terminals 22a, 22b, 24a, and 24b so that the terminals are exposed in the holes. The recess, into which the inner thermocouple 48 is to be inserted, is formed at the center of the back surface of the ceramic plate 20. Subsequently, the drilled hole 28 is formed radially inward from the outer peripheral surface of the ceramic plate 20 toward the center of the ceramic plate 20. The opening of the drilled hole 28 is closed with the cap 30, thereby forming the thermocouple conduit 26. Then, a hole is formed in the back surface of the ceramic plate 20 so as to be inclined toward an end portion of the thermocouple conduit 26 near the center of the ceramic plate 20, and the thermocouple guide 32 is inserted into the hole. Subsequently, the shaft 40 is positioned at the center of the ceramic plate 20. In this state, the cap 30, the thermocouple guide 32, and the shaft 40 are diffusion bonded to the ceramic plate 20. Because these members are all made from the same material, all diffusion bonding can be performed in one step.

Subsequently, in the shaft 40, the power feed rods 42a, 42b, 44a, and 44b are respectively connected to the terminals 22a, 22b, 24a, and 24b, and the temperature sensing portion 48a of the inner thermocouple 48 is inserted into the recess in the ceramic plate 20. The outer thermocouple 50 is inserted through the guide hole 32a in the thermocouple guide 32 and through the thermocouple conduit 26 until the outer thermocouple 50 comes into contact with the back surface of the cap 30. At this time, because the guide hole 32a is formed so as to be inclined with respect to the direction in which the thermocouple conduit 26 extends, the angle $\alpha$ formed between the guide hole 32a and the thermocouple conduit 26 is an obtuse angle. Thus, it is unlikely that the front end of the outer thermocouple 50 will become trapped at a corner when the front end is inserted through the guide hole 32a toward the thermocouple conduit 26. Therefore, the outer thermocouple 50 can be smoothly inserted into the thermocouple conduit 26.

Because the ceramic heater 10 according to the present embodiment described above includes the thermocouple guide 32, an operation of inserting the outer thermocouple 50 into the thermocouple conduit 26 can be smoothly performed and thereby the ceramic heater 10 can be easily manufactured. As a result, the productivity is improved. Instead of attaching the thermocouple guide 32, a guide hole extending at an angle may be formed in the ceramic plate 20. In this case, however, the length of the guide hole is insufficient as compared with the thermocouple guide 32 because the ceramic plate 20 is thin, so that the outer thermocouple 50 cannot be smoothly inserted.

Because the thermocouple guide 32 is made from the same material as the ceramic plate 20, the thermocouple guide 32 and the ceramic plate 20 can be integrated with each other by diffusion bonding.

Moreover, because the thermocouple conduit 26 is constituted by the drilled hole 28 and the cap 30, the thermocouple conduit 26 can be manufactured relatively easily.

Needless to say, the present invention is not limited to the embodiment described above, and can be modified in various ways within the technical scope of the present invention.

Figure 2:
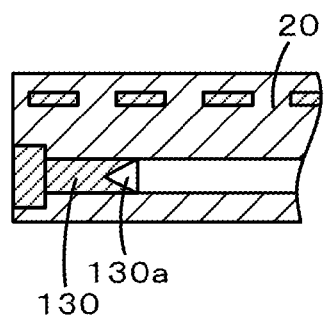
Figure 2:
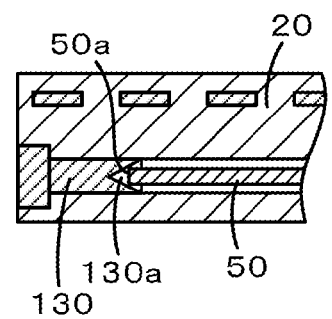
Figure 3:
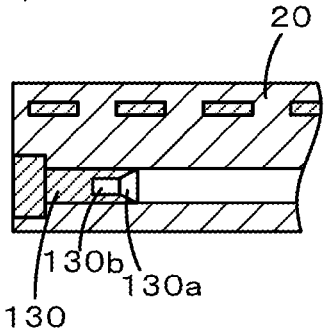
Figure 3:
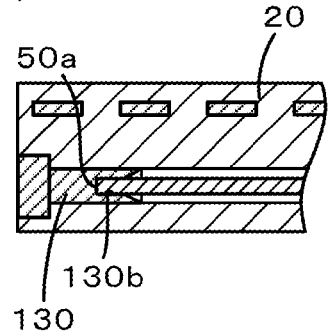

For example, in the embodiment described above, the back surface of the cap 30 is not particularly machined. However, a support portion for supporting the temperature sensing portion 50a may be formed at the back surface. To be specific, as illustrated in FIG. 2, a tapered portion 130a may be formed by drilling the back surface of the cap 130 in a horizontal direction, and the tapered portion 130a may be used as the support portion. Part (a) of FIG. 2 illustrates a state before insertion of the temperature sensing portion 50a, and part (b) illustrates a state after insertion of the temperature sensing portion 50a. The tapered portion 130a is configured so that the diameter thereof decreases with decreasing distance of the tapered portion from the outer peripheral surface of the ceramic plate 20. The temperature sensing portion 50a is supported by a portion of the inner wall of the tapered portion 130a at which the diameter of the portion is the same as the outside diameter of the temperature sensing portion 50a. Alternatively, as illustrated in FIG. 3, a tunnel portion 130b may be formed so as to extend from the tapered portion 130a toward the outer peripheral surface of the ceramic plate 20, and the tunnel portion 130b may be used as the support portion. Part (a) of FIG. 3 illustrates a state before insertion of the temperature sensing portion 50a, and part (b) illustrates a state after insertion of the temperature sensing portion 50a. The tunnel portion 130b is a hole having a diameter that is substantially the same as the outer diameter of the temperature sensing portion 50a. In this case, the temperature sensing portion 50a is supported by being inserted into the tunnel portion 130b. With either of the structures illustrated in FIGS. 2 and 3, the temperature sensing portion 50a of the outer thermocouple 50 is in contact with the same position on the cap 30 while being continuously supported by the support portion of the cap 30. Therefore, the accuracy with which temperature is measured is increased.

Figure 4:
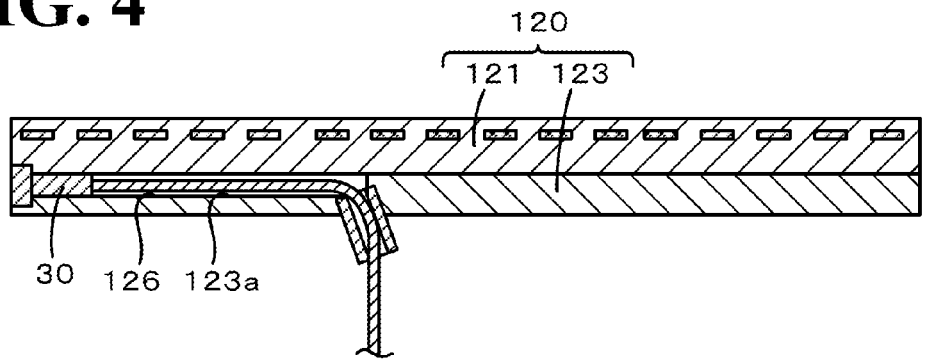
FIG. 4 is a partial sectional view of a ceramic heater that is different from the ceramic heater 10.
Figure 5:
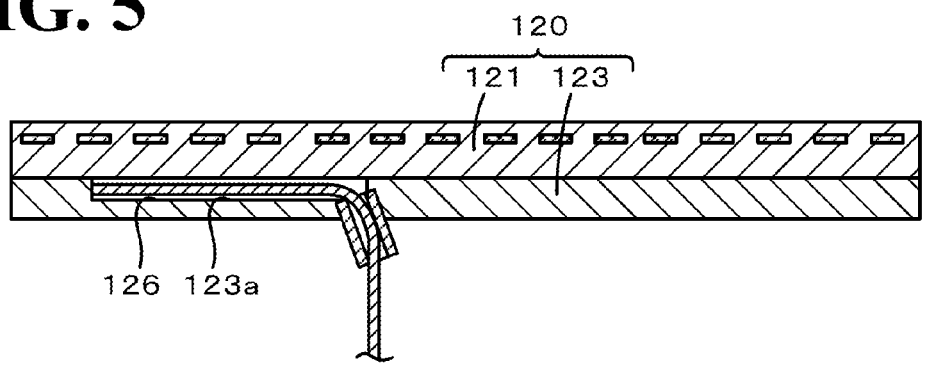
FIG. 5 is a partial sectional view of a ceramic heater that is different from the ceramic heater 10.

In the embodiment described above, the ceramic plate 20 used is a monolithic sintered body. However, as illustrated in FIGS. 4 and 5, a ceramic plate 120 including a pair of upper and lower thin plates 121 and 123 that are surface-bonded to each other may be used. In this case, a passage groove 123a to become a thermocouple conduit 126 after the surface bonding has been finished is formed in an upper surface of the lower thin plate 123. For example, as illustrated in FIG. 4, in the case where the passage groove 123a is formed so as to extend from a central portion of the lower thin plate 123 and through the outer peripheral surface of the lower thin plate 123, when the pair of upper and lower thin plates 121 and 123 are surface-bonded to each other, the passage groove 123a has an opening in the outer peripheral surface of the ceramic plate 120 as with the drilled hole 28 of the first embodiment. Therefore, the cap 30 is necessary to close the opening. On the other hand, as illustrated in FIG. 5, in the case where the passage groove 123a is formed from a central portion of the lower thin plate 123 to a position which is short of the outer peripheral surface, when the pair of upper and lower thin plates 121 and 123 are surface-bonded to each other, the thermocouple conduit 126 has a closed end at the position which is short of the outer peripheral surface of the ceramic plate 120. Therefore, the cap 30 is not necessary. The passage groove may be formed in a lower surface of the upper thin plate 121 or may be formed in each of the lower surface of the upper thin plate 121 and the upper surface of the lower thin plate 123.

Figure 6:
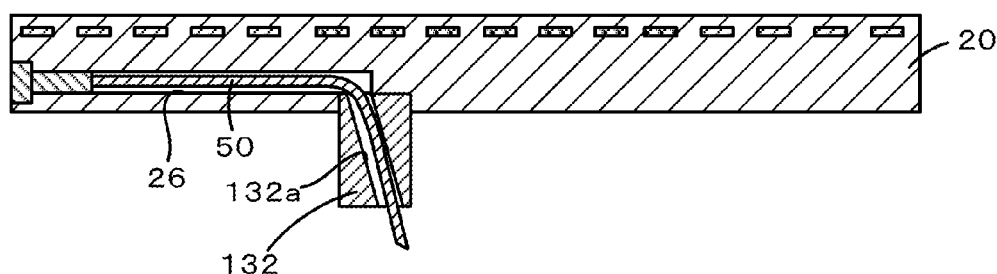
FIG. 6 is a partial sectional view of a ceramic heater that is different from the ceramic heater 10.
Figure 7:
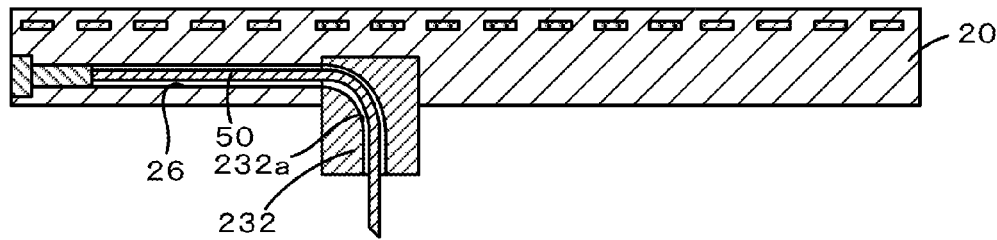
FIG. 7 is a partial sectional view of a ceramic heater that is different from the ceramic heater 10.

In the embodiment described above, the thermocouple guide 32 is attached to the back surface of the ceramic plate 20 so as to be inclined. However, as illustrated in FIG. 6, a thermocouple guide 132, which is a solid cylindrical body in which a guide hole 132a is formed so as to extend at an angle, may be attached to the back surface. The guide hole 132a forms an obtuse angle with the thermocouple conduit 26. The thermocouple guide 132 is attached perpendicularly to the back surface of the ceramic plate 20. Alternatively, as illustrated in FIG. 7, a thermocouple guide 232, which is a solid cylindrical body in which a curved guide hole 232a is formed, may be attached to the back surface. The angle formed by the curved guide hole 232a and the direction in which the thermocouple conduit 26 extends (an obtuse angle formed by the thermocouple conduit 26 and a tangent line of the guide hole 232a) increases with decreasing distance of the guide hole 232a from the thermocouple conduit 26. In either of these cases, as with the embodiment described above, an operation of inserting the outer thermocouple 50 into the thermocouple conduit 26 can be smoothly performed.

Figure 8:
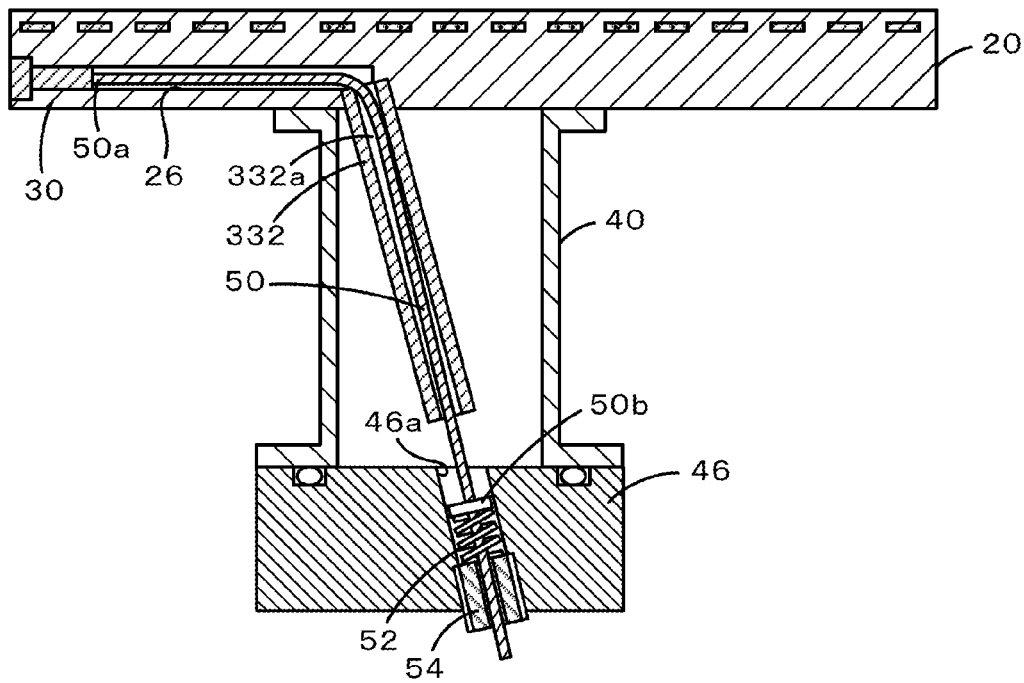
FIG. 8 is a longitudinal sectional view of a ceramic heater that is different from the ceramic heater 10.

In the embodiment described above, as illustrated in FIG. 8, a thermocouple guide 332 may have the largest possible length in the shaft 40. In this case, because a guide hole 332a is sufficiently long, an operation of inserting the outer thermocouple 50 into the thermocouple conduit 26 can be more smoothly performed. The outer thermocouple 50 may be pressed by a spring 52 so that the temperature sensing portion 50a is in contact with the back surface of the cap 30. To be specific, as illustrated in FIG. 8, a flange 50b for receiving the spring 52 is formed at the tail end of the outer thermocouple 50, and an inclined through-hole 46a that is coaxial with the guide hole 332a is formed in the support base 46. A screw thread is formed in the inner wall of the through-hole 46a. Before attaching the shaft 40 to the support base 46, the outer thermocouple 50 is inserted into the thermocouple conduit 26 and the outer thermocouple 50 is inserted into the through-hole 46a of the support base 46. Then, the shaft 40 is attached to the support base 46. Subsequently, the spring 52 is inserted into the through-hole 46a, and a cylindrical fixation screw 54 is screwed and fastened into the through-hole 46a. In this case, the temperature sensing portion 50a of the outer thermocouple 50 is continuously pressed against the back surface of the cap 30 by the spring 52. Thus, the accuracy with which the temperature of an outer peripheral portion of the ceramic plate 20 is measured is increased.

Figure 9:
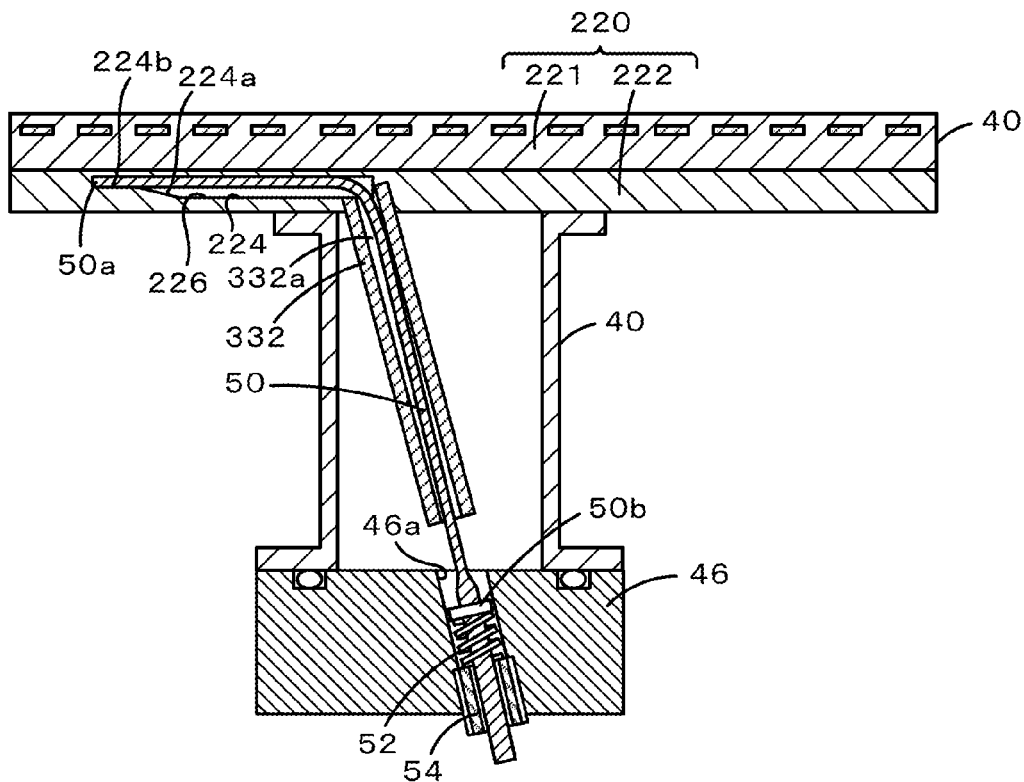
FIG. 9 is a longitudinal sectional view of a ceramic heater that is different from the ceramic heater 10.

FIG. 9 is a sectional view of a ceramic heater having the structure illustrated in FIG. 8 and including a ceramic plate 220 formed by surface bonding a pair of thin plates 221 and 223 to each other. Here, a passage groove 224 includes a support portion that supports the temperature sensing portion 50a at an end portion thereof that is in contact with the temperature sensing portion 50a of the outer thermocouple 50. To be specific, the passage groove 224 includes a tapered portion 224a and a tunnel portion 224b. The groove depth of the tapered portion 224a decreases with decreasing distance of the passage groove 224 from the outer peripheral surface of the ceramic plate 220. The tunnel portion 224b is formed so as to extend from the tapered portion 224a toward the outer peripheral surface of the ceramic plate 220 and has a groove depth that is substantially the same as that of the outside diameter of the temperature sensing portion 50a. The tunnel portion 224b serves as a support portion. In this case, the temperature sensing portion 50a is in contact with the same position in the ceramic plate 220 while being continuously supported by the tunnel portion 224b. As a result, the accuracy with which temperature is measured is increased.

Figure 10:
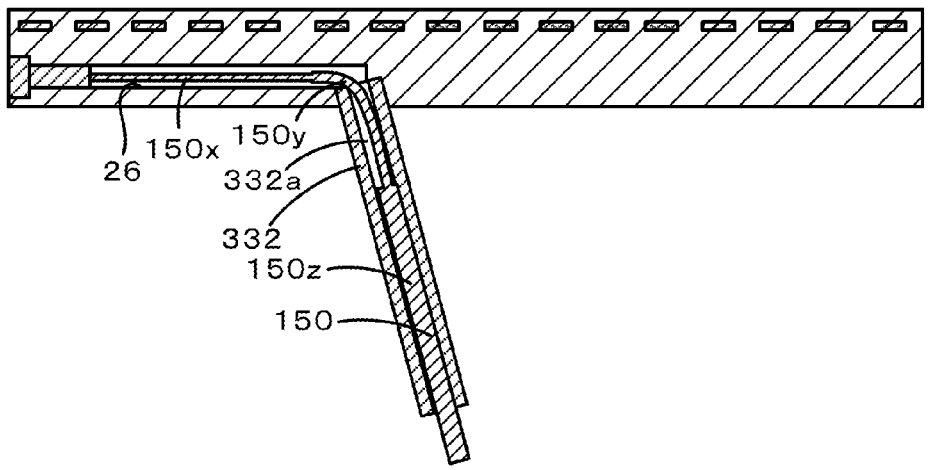
FIG. 10 is a partial sectional view of a ceramic heater that is different from the ceramic heater 10.

FIG. 10 is a partial sectional view of a ceramic heater having the structure illustrated in FIG. 8 and including an outer thermocouple 150 having a non-uniform diameter. Here, an inclined portion 150z extending at an angle has a diameter larger than those of a horizontal portion 150x disposed in the thermocouple conduit 26 and a curved portion 150y extending from the guide hole 332a to the thermocouple conduit 26. To be specific, the inclined portion 150z has the largest diameter, the curved portion 150y has the second largest diameter, and the horizontal portion 150x has the smallest diameter. In this case, the outer thermocouple 150 can be easily inserted and the shape thereof after the insertion is more likely to be stabilized. In FIG. 10, the boundary between the inclined portion 150z and the curved portion 150y has a stepped shape. However, the boundary may have a tapered shape.

Figure 11:
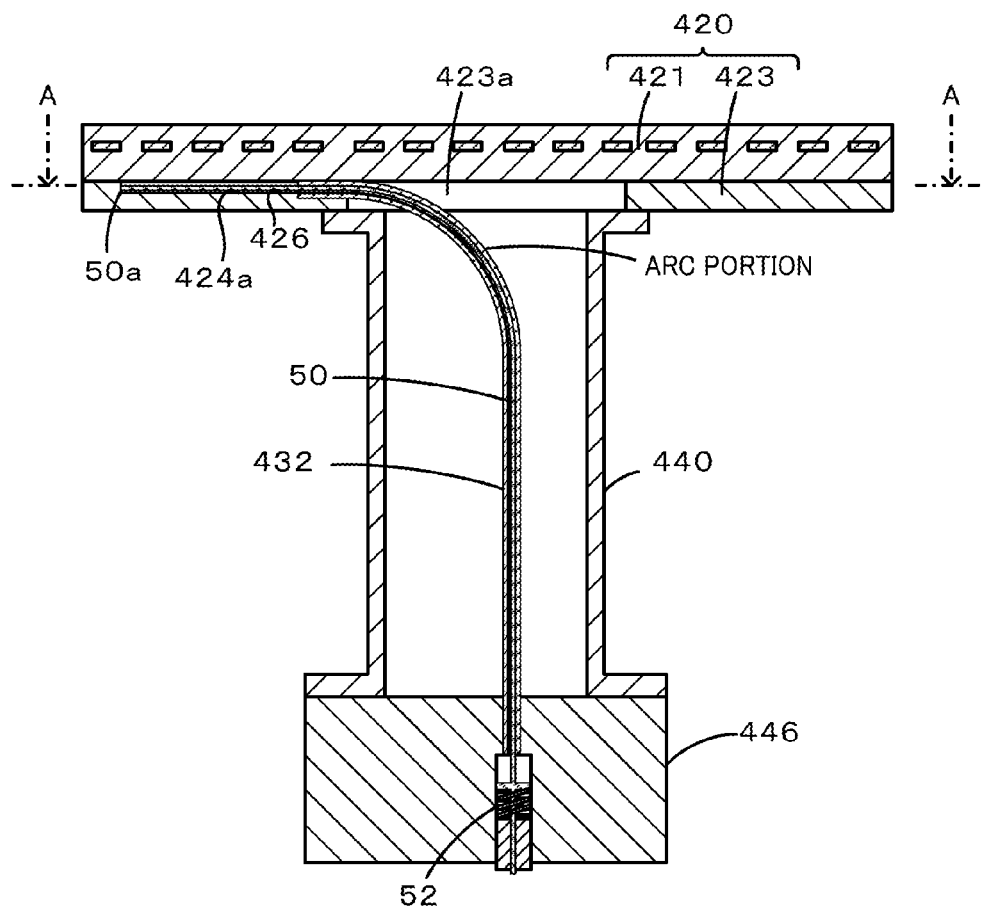
FIG. 11 is a longitudinal sectional view of a ceramic heater that is different from the ceramic heater 10.
Figure 12:
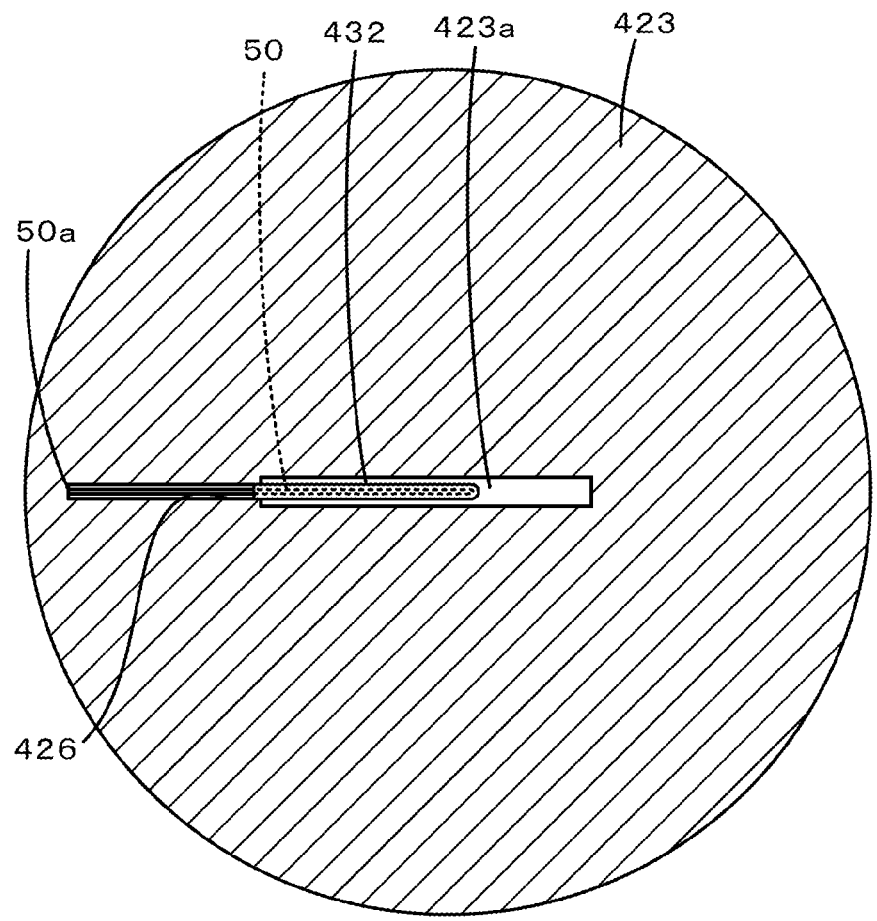
FIG. 12 is a sectional view taken along line A-A of FIG. 11.

FIG. 11 is a longitudinal sectional view of a ceramic heater including a ceramic plate 420 formed by surface bonding a pair of thin plates 421 and 423 to each other and including a pipe-shaped thermocouple guide 432 having an arc portion. FIG. 12 is a sectional view taken along line A-A of FIG. 11. A thermocouple conduit 426 is formed by surface bonding the thin plate 423 on the lower side, in which a passage groove 424a has been formed so as to extend from a central portion to a position which is short of the outer peripheral surface, to the thin plate 421 on the upper side. The thermocouple guide 432 extends from a support base 446 through the inside of a shaft 440 and is connected to an end portion of the thermocouple conduit 426 at the central portion. The thermocouple guide 432 extends straightly upward inside the shaft 440, and then the thermocouple guide 432 is bent into an arc shape by 90°, guided along a slit 423a formed in the thin plate 423 on the lower side, and connected to the thermocouple conduit 426. The outer thermocouple 50 is a sheath thermocouple. The outer thermocouple 50 is inserted from below the thermocouple guide 432 and is guided to the thermocouple conduit 426 after the thermocouple guide 432 has been attached to the ceramic plate 420 and before the support base 446 is attached. As in the case of FIG. 8, the outer thermocouple 50 is pressed by the spring 52, and the temperature sensing portion 50a is pressed against a closed end of the thermocouple conduit 426. By using the thermocouple guide 432 having such a structure, an operation of inserting the outer thermocouple 50 into the thermocouple conduit 426 can be performed more smoothly. The radius of curvature of the arc portion of the thermocouple guide 432 may be appropriately determined in accordance with the outside diameter, the material, and the like of the outer thermocouple 50. For example, the radius of curvature may be 20 to 50 times, or preferably 30 to 40 times the outside diameter of the outer thermocouple 50.

Figure 13:
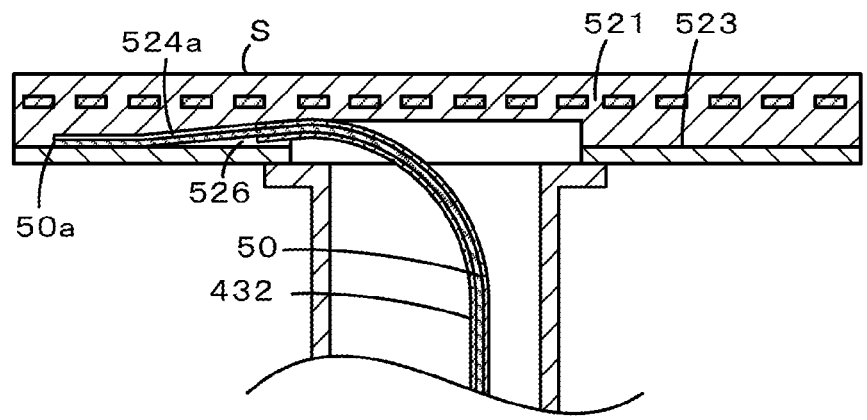
FIG. 13 is a partial sectional view of a modification of FIG. 11.

FIG. 13 is a partial sectional view of a modification of FIG. 11. In FIG. 11, the thermocouple conduit 426 extends substantially parallel to the wafer-placing surface S. In FIG. 13, a top wall of a thermocouple conduit 526 extends substantially parallel to the wafer-placing surface S from an outer peripheral portion to a middle portion toward the center and extends in an upwardly inclined direction from the middle portion toward the center. The thermocouple conduit 526 is a passage surrounded by a passage groove 524a formed in an upper thin plate 521 and a lower thin plate 523. In this case, a front end of the thermocouple guide 432 having an arc portion can be easily inserted into the thermocouple conduit 526. Not only the top wall but also the entirety of the thermocouple conduit 526 may be inclined. Instead of the thermocouple conduit 526, a thermocouple conduit having a top wall that extends substantially parallel to the wafer-placing surface S and a bottom portion that extends substantially parallel to the wafer-placing surface S from an outer peripheral portion to a middle portion toward the center and extends in a downwardly inclined direction from the middle portion toward the center may be used. Also in this case, not only the bottom portion but also the entirety of the

EXAMPLES

Example 1

A ceramic heater having the structure illustrated in FIG. 9 was fabricated. The ceramic plate 220 used was made from AlN, had an outside diameter of φ350 mm, and was formed by solid-state bonding the upper and lower thin plates 221 and 222, each having a thickness of 10 mm, so that the bonded interface had hermeticity. The shaft 40 used had a length of 200 mm and an inside diameter of φ50 mm. The closed end of a thermocouple conduit 226 was distanced by 120 mm from the center of the ceramic plate 220. A portion of the thermocouple conduit 226 from an end near the center of the ceramic plate 220 to the tapered portion 224a had a horizontal length L2 of 100 mm, a width in the range of 2 to 3 mm, and a depth the same as the width. The tapered portion 224a had a horizontal length of 10 mm. The tunnel portion 224b had a horizontal length L1 of 10 mm, a width of 1.1 mm, and a depth the same as the width. The cross-sectional shape of the thermocouple conduit 226 was a square shape or a U-shape. The thermocouple guide 332 was made from AlN and had an outside diameter of φ10 mm and a length of 50 mm. The guide hole 332a had an inside diameter of φ3 mm. The angle (obtuse angle) between the guide hole 332a and the thermocouple conduit 226 was 100°. The outer thermocouple 50 is inserted through the guide hole 332a into the thermocouple conduit 226. The outer thermocouple 50 used was a type-K thermocouple including a sheath made from SUS316 and having a sheath outside diameter φ1.0 mm. The temperature sensing portion 50a had a flat end surface. As a result, the outer thermocouple 50 could be smoothly inserted without being trapped until the temperature sensing portion 50a reached the closed end through the tunnel portion 224b.

Example 2

A ceramic heater having the structure illustrated in FIG. 11 was fabricated. Here, whether the outer thermocouple 50 could be inserted into the thermocouple guide 432 after the thermocouple guide 432 had been attached to the ceramic plate 420 and before the shaft 440 and the support base 446 were attached was examined. The outer thermocouple 50 used was a type-K thermocouple including a sheath having an outside diameter of φ1.0 mm and made from SUS304. As the thermocouple guide 432, a pipe having an outside diameter of φ2.0 mm and a thickness of 0.2 mm was used. When the radius of curvature of the arc portion of the thermocouple guide 432 was 40 mm (40 times the sheath outside diameter), the outer thermocouple 50 could be inserted smoothly. Also when the radius of curvature of the arc portion of the thermocouple guide 432 was 30 mm (30 times the sheath outside diameter), the outer thermocouple 50 could be inserted smoothly.

The present application claims priority from U.S. provisional patent application No. 61/386,011 filed on Sep. 24, 2010, the entire contents of which are incorporated herein by reference.

INDUSTRIAL APPLICABILITY

The present invention is used as a semiconductor manufacturing apparatus member, that is, a component of an apparatus used to manufacture a semiconductor and the like, such as an electrostatic chuck or a ceramic heater.

The invention claimed is:

1. A semiconductor manufacturing apparatus member comprising:
   a disk-shaped ceramic plate including a wafer-placing surface;
   a thermocouple conduit disposed in the ceramic plate and extends from a radially central portion of the ceramic plate to a position which is spaced from an outer peripheral surface of the ceramic plate;
   a thermocouple guide including a guide hole extending from a surface of the ceramic plate opposite to the wafer-placing surface and is connected to a portion of the thermocouple conduit at the radially central portion of the ceramic plate; and a thermocouple extending through the guide hole and the thermocouple conduit, the thermocouple being disposed so that a temperature sensing portion thereof is in contact with a closed end of the thermocouple conduit, the closed end being located at the position which is spaced from the outer peripheral surface of the ceramic plate, wherein the guide hole is inclined with respect to a direction in which the thermocouple conduit extends so that the guide hole makes an obtuse angle with the thermocouple conduit, or the guide hole extends in a direction closer to the direction in which the thermocouple conduit extends with decreasing distance of the guide hole from the thermocouple conduit, the ceramic plate includes a pair of thin plates that are surface-bonded to each other, and the thermocouple conduit is formed by a radial passage groove formed in a bonding surface of at least one of the pair of thin plates.

2. The semiconductor manufacturing apparatus member according to claim 1, wherein a portion of the guide hole that extends in a direction closer to the direction in which the thermocouple conduit extends with decreasing distance of the guide hole from the thermocouple conduit is formed as a circular arc or an elliptic arc.

3. The semiconductor manufacturing apparatus member according to claim 1, wherein the thermocouple guide is made from the same material as the ceramic plate.

4. The semiconductor manufacturing apparatus member according to claim 1, wherein the thermocouple is pressed by a spring so that the temperature sensing portion is in contact with the closed end.

5. The semiconductor manufacturing apparatus member according to claim 1, wherein the passage groove includes a support portion for supporting the temperature sensing portion of the thermocouple at an end portion at which the passage groove is in contact with the temperature sensing portion.

6. A semiconductor manufacturing apparatus member comprising:

a disk-shaped ceramic plate including a wafer-placing surface;

a thermocouple conduit disposed in the ceramic plate and extends from a radially central portion of the ceramic plate to a position which is spaced from an outer peripheral surface of the ceramic plate;

a thermocouple guide including a guide hole extending from a surface of the ceramic plate opposite to the wafer-placing surface and is connected to a portion of the thermocouple conduit at the radially central portion of the ceramic plate; and a thermocouple extending through the guide hole and the thermocouple conduit, the thermocouple being disposed so that a temperature sensing portion thereof is in contact with a closed end of the thermocouple conduit, the closed end being located at the position which is spaced from the outer peripheral surface of the ceramic plate, wherein the guide hole is inclined with respect to a direction in which the thermocouple conduit extends so that the guide hole makes an obtuse angle with the thermocouple conduit, or the guide hole is extends in a direction closer to the direction in which the thermocouple conduit extends with decreasing distance of the guide hole from the thermocouple conduit, and the thermocouple conduit is a hole that is radially formed by drilling the ceramic plate from the outer peripheral surface toward a radial center of the ceramic plate, and sealing an end portion of the thermocouple conduit that is open in the outer peripheral surface with a cap that is made from the same material as the ceramic plate.

7. The semiconductor manufacturing apparatus member according to claim 6, wherein the cap includes a support portion that supports the temperature sensing portion of the thermocouple at a position at which the cap is in contact with the temperature sensing portion.

8. The semiconductor manufacturing apparatus member according to claim 6, wherein a portion of the guide hole that extends in a direction closer to the direction in which the thermocouple conduit extends with decreasing distance of the guide hole from the thermocouple conduit is formed as a circular arc or an elliptic arc.

9. The semiconductor manufacturing apparatus member according to claim 6, wherein the thermocouple guide is made from the same material as the ceramic plate.

10. The semiconductor manufacturing apparatus member according to claim 6, wherein the thermocouple is pressed by a spring so that the temperature sensing portion is in contact with the closed end.

* * * * *

UNITED STATES PATENT AND TRADEMARK OFFICE
CERTIFICATE OF CORRECTION

PATENT NO.       : 8,790,007 B2  
APPLICATION NO.  : 13/459695  
DATED            : July 29, 2014  
INVENTOR(S)      : Yoshinobu Goto Page 1 of 1

It is certified that error appears in the above-identified patent and that said Letters Patent is hereby corrected as shown below:

On the title page (Item 56) Foreign Patent Documents

Please Add: "CN 101689486 A 3/2010" and "CN 101772837 A 7/2010"

On the title page (Item 56) Other Publications

Please Add: "Chinese Office Action, dated March 3, 2014 (8 pages)."

Signed and Sealed this  
Twenty-first Day of October, 2014

Michelle K. Lee  
*Deputy Director of the United States Patent and Trademark Office*